(12) United States Patent
Park

(10) Patent No.: US 8,995,212 B2
(45) Date of Patent: Mar. 31, 2015

(54) COLUMN REPAIR CIRCUIT

(75) Inventor: Nak Kyu Park, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 275 days.

(21) Appl. No.: 13/585,169

(22) Filed: Aug. 14, 2012

(65) Prior Publication Data

US 2013/0315016 A1 Nov. 28, 2013

(30) Foreign Application Priority Data

May 25, 2012 (KR) ........................ 10-2012-0056120

(51) Int. Cl.
*G11C 29/00* (2006.01)
*G11C 17/16* (2006.01)
*G11C 17/18* (2006.01)

(52) U.S. Cl.
CPC .............. *G11C 29/808* (2013.01); *G11C 17/16* (2013.01); *G11C 17/18* (2013.01); *G11C 29/787* (2013.01)
USPC ........................................ 365/200; 365/225.7

(58) Field of Classification Search
CPC ..... G11C 29/785; G11C 17/16; G11C 29/027

USPC ............................................... 365/200, 225.7
See application file for complete search history.

(56) References Cited

U.S. PATENT DOCUMENTS 8,116,156 B2 * 2/2012 Riho et al. ..................... 365/200
2011/0158013 A1 * 6/2011 Kim .............................. 365/200

FOREIGN PATENT DOCUMENTS

KR 1020040090557 A 10/2004

* cited by examiner

*Primary Examiner* — Pho M Luu
(74) *Attorney, Agent, or Firm* — William Park & Associates Patent Ltd.

(57) ABSTRACT

A column repair circuit of a semiconductor memory apparatus includes a plurality of mats and performs a column repair operation to replace failed cells among a plurality of memory cells provided in the mats. The column repair circuit includes two or more fuse units configured to perform the column repair operation. Each of the fuse units includes a plurality of fuses, and is configured in such a manner that m mats correspond to one fuse or n mats correspond to one fuse, where m and n are natural numbers equal to or more than 1 and different from each other.

18 Claims, 9 Drawing Sheets

COLUMN REPAIR CIRCUIT

CROSS-REFERENCES TO RELATED APPLICATION

The present application claims priority under 35 U.S.C. §119(a) to Korean application number 10-2012-0056120 filed on May 25, 2012, in the Korean Intellectual Property Office, which is incorporated by reference in its entirety.

BACKGROUND

1. Technical Field

The present invention relates to a semiconductor circuit, and more particularly, to a column repair circuit.

2. Related Art

In general, a semiconductor memory apparatus includes a plurality of mats, and each mat includes numerous memory cells. A failure in any one of the numerous memory cells may cause the semiconductor memory apparatus to malfunction, which may lead to the entire semiconductor memory apparatus to be discarded as a defective product. Therefore, a repair circuit is used to replace the failed memory cell with a cell included in a redundancy circuit. When a failure occurs in a memory cell, the repair circuit recognizes the failed memory cell in advance, and when access to the corresponding memory cell is requested, the repair circuit replaces the memory cell with the cell included in the redundancy circuit. Here, the redundancy circuit refers to a group of spare memory cells which are separately prepared.

A variety of methods may be used to replace a failed memory cell with a redundancy memory cell. Such methods may include replacing a memory cell by row, replacing a memory cell by column, and replacing a memory cell by memory cell.

The method for replacing a memory cell by column corresponding to bit lines is generally used. In this method, when a failure occurs in a memory cell of a mat, a fuse is cut to replace a column including the failed memory cell with a redundancy column.

The above-described column repair method is advantageous in that a memory cell may be repaired using column addresses of the mat. However, when failures uniformly occur in memory cells of a plurality of mats, fuses of all corresponding mats must be cut. Furthermore, even when memory cell failures occur in portions of the mats, fuses of all corresponding mats must be cut. Thus, unnecessary repair time may be required, and excessive fuse cutting may reduce the reliability of the semiconductor apparatus.

SUMMARY

In an embodiment of the present invention, a column repair circuit of a semiconductor memory apparatus which includes a plurality of mats performs a column repair operation to replace failed cells among a plurality of memory cells provided in the mats. The column repair circuit includes two or more fuse units configured to perform the column repair operation. Each of the fuse units includes a plurality of fuses, and is configured in such a manner that m mats correspond to one fuse and n mats correspond to another fuse, where m and n are natural numbers greater than or equal to 1 and differ from each other.

In an embodiment of the present invention, a column repair circuit includes a combined mat address generation unit and at least two fuse units. The combined mat address generation unit is configured to receive mat addresses, perform one or more combination steps according to a method of combining the received mat addresses by adjacent addresses and recombining the combination results by adjacent values, and outputs the received mat addresses and the combination results of the respective combination steps as combined mat addresses of the respective steps. The two or more fuse units each include a plurality of fuses corresponding to the combined mat addresses based on respective bits of a column address, and are configured to replace a corresponding column of the inputted column address with a redundancy column depending on whether or not a fuse corresponding to a selected combined mat address is cut, wherein each of the fuse units receives the combined mat addresses outputted at any one step of the method described above.

In an embodiment of the present invention, a column repair circuit includes a combined mat address generation unit and at least two fuse units. The combined mat address generation unit is configured to receive x mat addresses, performs a plurality of combination steps according to a method of combining the received x mat addresses by adjacent addresses and recombining the combination results by adjacent values, and outputs the x mat addresses, x/2 combination results, x/4 combination results, and x/8 combination results as combined mat addresses of the respective steps. The two or more fuse units each include a plurality of fuses corresponding to the combined mat addresses based on respective bits of a column address, and are configured to replace a corresponding column of the inputted column address with a redundancy column depending on whether or not a fuse corresponding to a selected combined mat address is cut, wherein each of the fuse units receives the combined mat addresses outputted at any one of the steps of the method described above.

BRIEF DESCRIPTION OF THE DRAWINGS

Features, aspects, and embodiments are described in conjunction with the attached drawings, in which.

DETAILED DESCRIPTION

Hereinafter, a column repair circuit according to the present invention will be described below with reference to the accompanying drawings through various embodiments.

Figure 1:
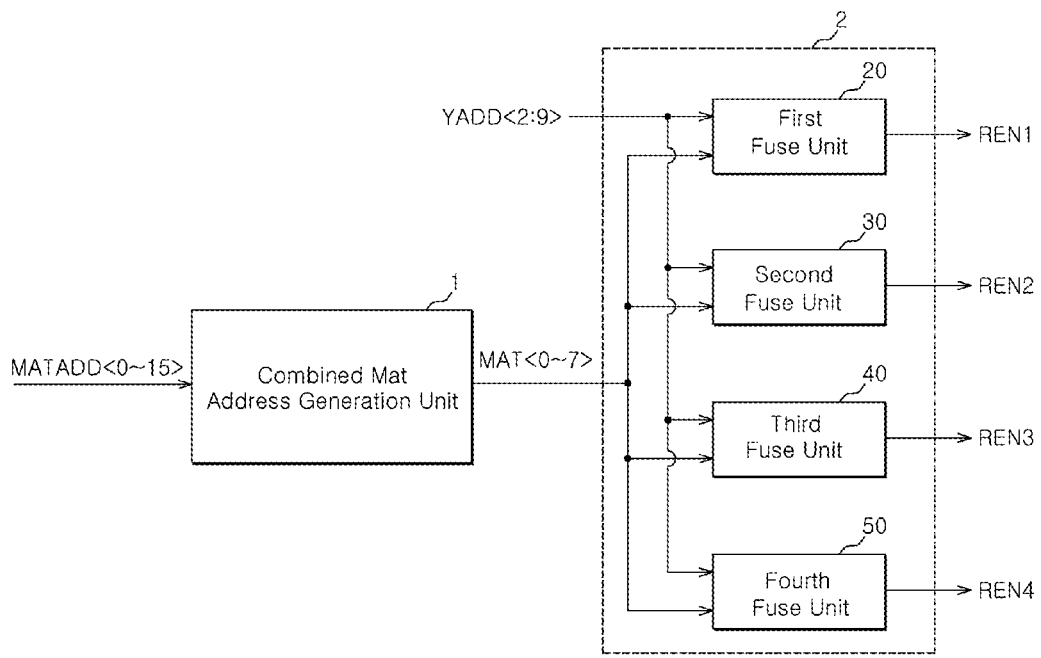
FIG. 1 is a block diagram of a column repair circuit according to an embodiment of the present invention.

FIG. 1 is a block diagram of a column repair circuit according to an embodiment of the present invention.

The column repair circuit illustrated in FIG. 1 includes a combined mat address generation unit 1 and a fuse unit 2.

The combined mat address generation unit 1 is configured to receive mat addresses MATADD<0~15>, combine the received addresses by adjacent address, and output the combined addresses as combined mat addresses MAT<0~7>. FIG. 1 illustrates a case in which the received mat addresses MATADD<0~15> include 16 addresses where two adjacent addresses are combined to output eight combined mat addresses MAT<0~7>. The combined mat address generation unit 1 is not limited to the embodiment of the present invention, but may receive various numbers of mat addresses MATADD and output various numbers of combined mat addresses MAT by combining the received mat addresses by a plurality of addresses.

The fuse unit 2 includes first to fourth fuse units 20 to 50 configured to receive the combined mat addresses MAT<0~7> and a column address YADD<2:9> to generate redundancy column enable signals REN1 to REN4, respectively. The column address YADD<2:9> is a code signal which is not decoded. The fuse unit 2 may include a fuse corresponding to each column address. In this embodiment of the present invention, the fuse unit 2 may include a fuse corresponding to each bit of the column address, in order to perform a repair operation.

According to the embodiment of the present invention, fuse sets (not illustrated) corresponding to the respective bits of the 8-bit column address YADD<2:9> are provided to repair 256 columns. It is difficult to repair all the columns using only one fuse unit. Accordingly, an efficient number of fuse units 20 to 50 may be included by taking into consideration factors such as available area for the fuse units as well as the repair yield.

The combined mat address generation unit 1 receives the mat addresses MATADD<0~15>, combines the received mat addresses MATADD<0~15> by adjacent address, and outputs the combination results as the mat addresses MAT<0~7>. The received mat addresses MATADD<0~15> are divided into a plurality of groups each including adjacent addresses. When any one of the addresses of one group is selected, a combined mat address corresponding to the selected address is selected and outputted to the fuse unit 2.

Referring to FIG. 1, the combined mat address generation unit 1 receives 16 mat addresses MATADD<0~15>, and divides the received mat addresses MATADD<0~15> into eight groups each including two adjacent addresses. For example, the mat addresses MATADD<0> and MATADD<1> may be combined and outputted, and the mat addresses MATADD<2> and MATADD<3> may be combined and outputted. In this way, eight combined mat addresses MAT<0~7> are generated. When any one of the mat addresses MATADD<0> and MATADD<1> is selected, the corresponding combined mat address MAT<0> may be selected and outputted, and when any one of the mat addresses MATADD<2> and MATADD<3> is selected, the corresponding combined mat address MAT<1> may be selected and outputted. In this way, the selection for the eight combined mat addresses MAT<0~7> is controlled. In this embodiment of the present invention, the combined mat addresses MAT are generated by combining the mat addresses by two adjacent addresses. However, the combined mat addresses MAT may be generated by combining the mat addresses by two or more addresses.

Each of the first to fourth fuse units 20 to 50 of the fuse unit 2 includes a fuse which is cut depending on whether or not a failure occurred in a corresponding memory cell. The fuse unit 2 determines whether or not to repair a column designated by the combined mat addresses MAT<0~7> and the column address YADD<2:9> selected according to whether or not the fuse is cut.

Figure 2:
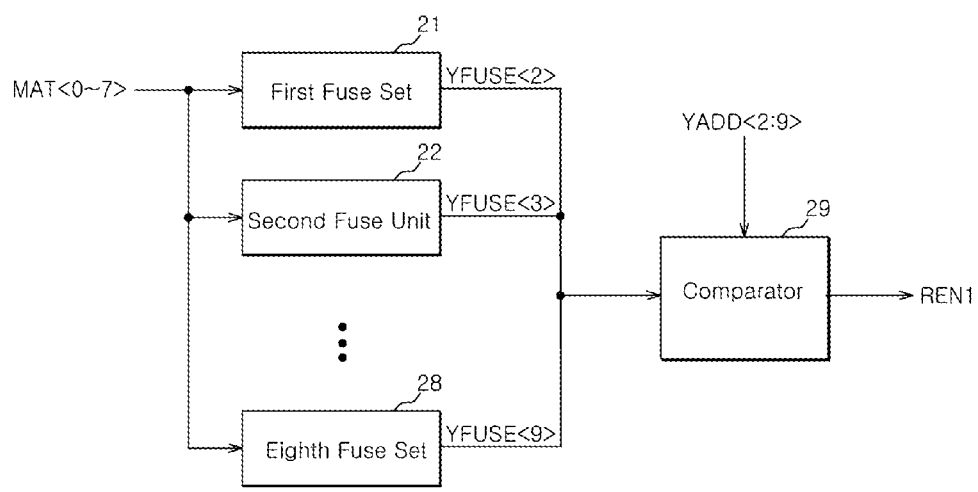
FIG. 2 is a block diagram of a first fuse unit of FIG. 1.

FIG. 2 is a block diagram of the first fuse unit 20. The detailed descriptions of the configuration of the first fuse unit 20 may also be applied to the second to fourth fuse units 30 to 50.

The first fuse unit 20 includes first to eighth fuse sets 21 to 28 and a comparator 29.

The number of the first to eighth fuse sets 21 to 28 corresponds to the bit number of the column address YADD<2:9>. Each of the fuse sets 21 to 28 includes a plurality of fuses corresponding to the number of the combined mat addresses MAT<0~7>.

Figure 3:
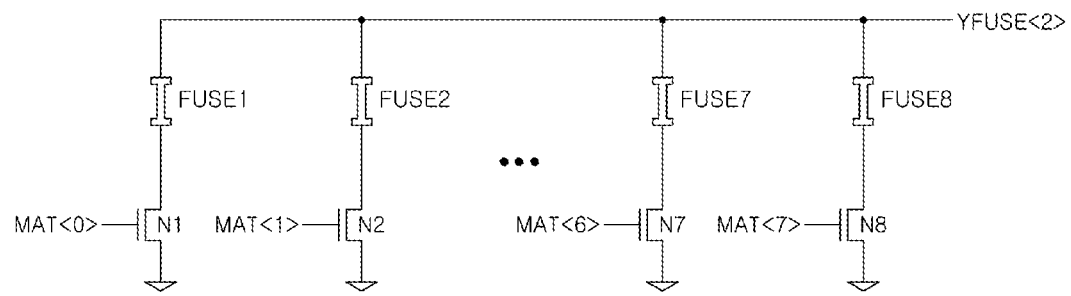
FIG. 3 is a circuit diagram of a first fuse set of FIG. 2.

For example, referring to FIG. 3, the first fuse set 21 includes a plurality of fuse FUSE1 to FUSE8 allocated to the first column address bit YADD<2>. The fuses FUSE1 to FUSE8 are connected to a plurality of transistors N1 to N8 to receive the combined mat addresses MAT<0~7>, respectively. Depending on whether or not the fuses FUSE1 to FUSE8 are cut, the state of a first fuse signal YFUSE<2> is determined.

When none of the fuses are cut, a deactivated first fuse signal YFUSE<2> is outputted regardless of which one of the combined mat addresses MAT<0~7> is selected. On the other hand, when any one of the combined mat addresses MAT<0~7> is selected and a fuse corresponding to the selected address is cut, an activated first fuse signal YFUSE<2> is outputted.

The second to eighth fuse sets 22 to 28 include a plurality of fuses allocated to the second to eighth column address bits YADD<3:9>, respectively, and operate in a similar manner to the first fuse set 21 so as to output second to eighth fuse signals YFUSE<3~9>.

The comparator 29 is configured to receive the column address YADD<2:9>, compare the received column address YADD<2:9> to the first to eighth fuse signals YFUSE<2~9>, and output a first redundancy column enable signal REN1. When the first to eighth fuse signals YFUSE<2~9> are matched with the inputted column address YADD<2:9>, the first redundancy column enable signal REN1 is activated.

When the first redundancy column enable signal REN1 is activated, columns of two mats corresponding to the selected combined mat address may be replaced with redundancy columns.

Similarly, when the second to fourth redundancy column enable signals REN2 to REN4 are activated according to the above-described manner, columns of two mats corresponding to the selected combined mat address may be replaced with redundancy columns.

Figure 4:
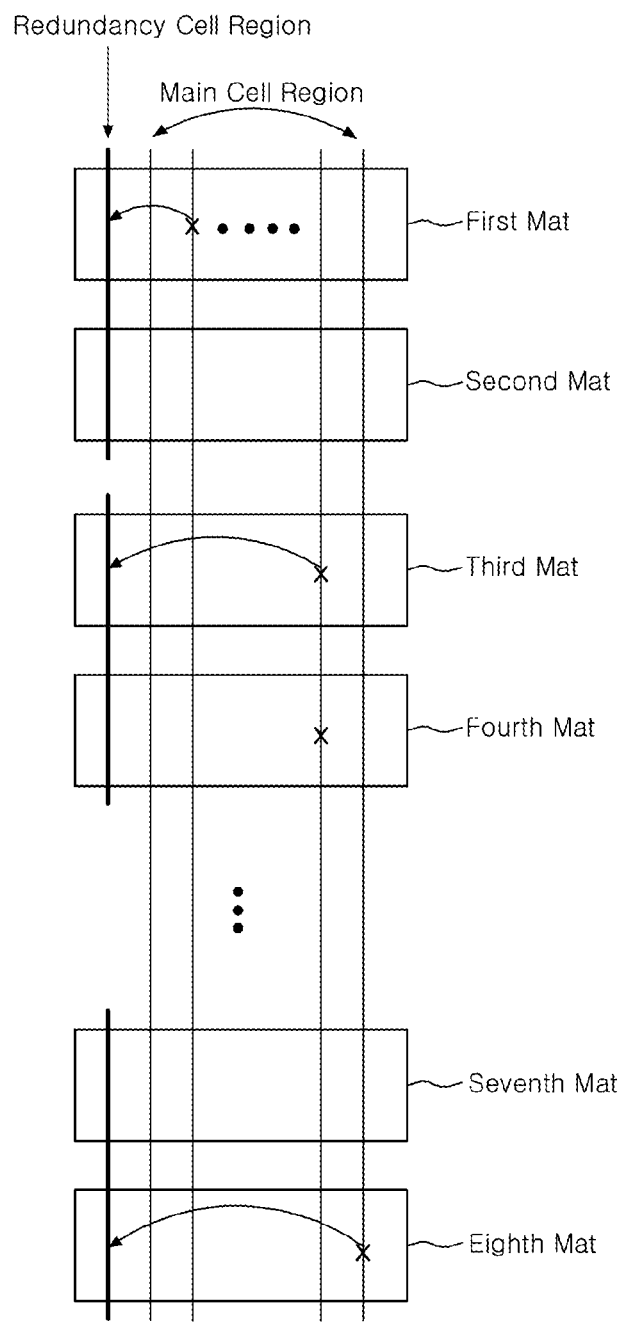
FIG. 4 illustrates a column repair operation according to an embodiment of the present invention.

FIG. 4 illustrates the column repair operation according to an embodiment of the present invention.

FIG. 4 illustrates a case in which failures occur in specific cells of first, third, fourth, and eighth mats in a main cell region. According to the embodiment of the present invention, two mat addresses are combined to perform a column repair operation. Although a failure occurs in a memory cell belonging to the first mat, corresponding columns of the first and second mats are replaced with redundancy columns. When failures occur in the same columns of the third and fourth mats, the repair operation may be performed more efficiently than when a repair operation is performed in one mat.

However, when column failures occur in the all mats due to reasons such as a tainted fabrication environment, all fuses corresponding to the mats must be cut, which is inefficient in terms of repair time and reliability. In order to remove the inefficiency, a repair operation may be set to be performed only by collectively repairing a plurality of mats. Inefficiency would then be measured in terms of the repair operation.

Figure 5:
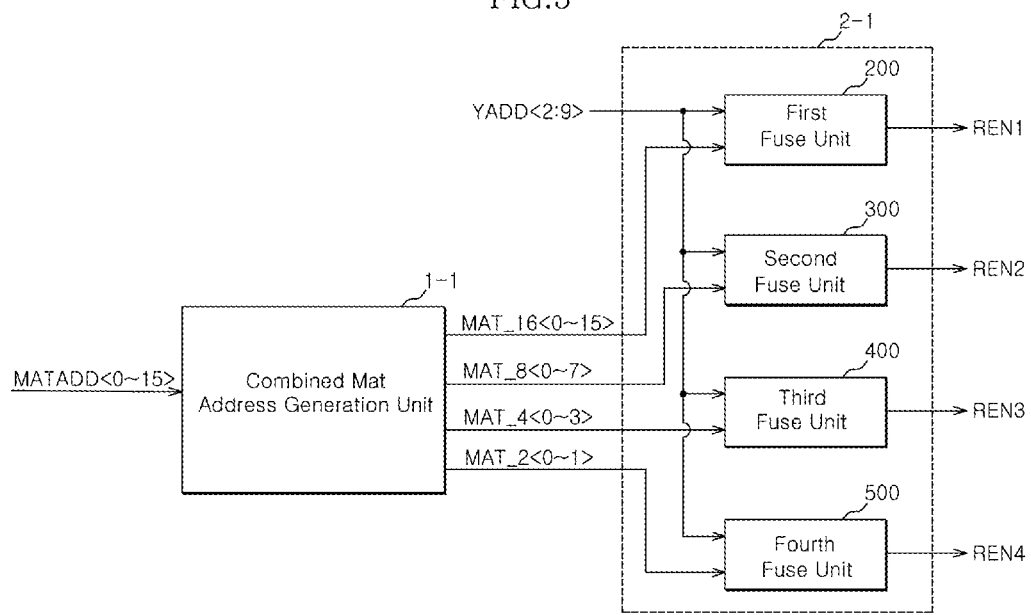
FIG. 5 is a block diagram of a column repair circuit according to an embodiment of the present invention.

FIG. 5 is a block diagram of a column repair circuit according to an embodiment of the present invention, illustrating a configuration for solving the above-described problems.

The repair circuit illustrated in FIG. 5 includes a combined mat address generation unit 1_1 and a fuse unit 2_1.

The combined mat address generation unit 1_1 is configured to receive mat addresses MATADD<0~15> and to perform one or more combination steps according to a method of combining the received mat addresses MATADD<0~15> by adjacent address and recombining the combination results by adjacent value. The combined mat address generation unit 1_1 outputs the received mat addresses MATADD<0~15> and the combination results of the aforementioned steps as first to fourth combined mat addresses MAT_16<0~15>, MAT_8<0~7>, MAT_4<0~3>, and MAT_2<0~1>, respectively. FIG. 5 illustrates a case in which the received mat addresses MATADD<0~15> include 16 addresses, and each two adjacent addresses are combined at each step, but the present invention is not limited thereto. For example, the combined mat address generation unit 1_1 may receive various numbers of mat addresses MATADD, combine the received mat addresses MATADD by a plurality of addresses, and output various combined mat addresses MAT.

The fuse unit 2_1 includes first to fourth fuse units 200 to 500. The first to fourth fuse units 200 to 500 are configured to receive a column address YADD<2:9> and the first to fourth combined mat addresses MAT_16<0~15>, MAT_8<0~7>, MAT_4<0~3>, and MAT_2<0~1>, to generate redundancy column enable signals REN1 to REN4, respectively.

According to the embodiment of the present invention, the first fuse unit 200 receives the first combined mat addresses MAT_16<0~15> and performs a column repair operation for one mat. The second fuse unit 300 receives the second combined mat addresses MAT_8<0~7> and performs a column repair operation for two mats. The third fuse unit 400 receives the third combined mat addresses MAT_4<0~3> and performs a column repair operation for four mats. The fourth fuse unit 500 receives the fourth combined mat addresses MAT_2<0~3> and performs a column repair operation for eight mats.

Figure 6:
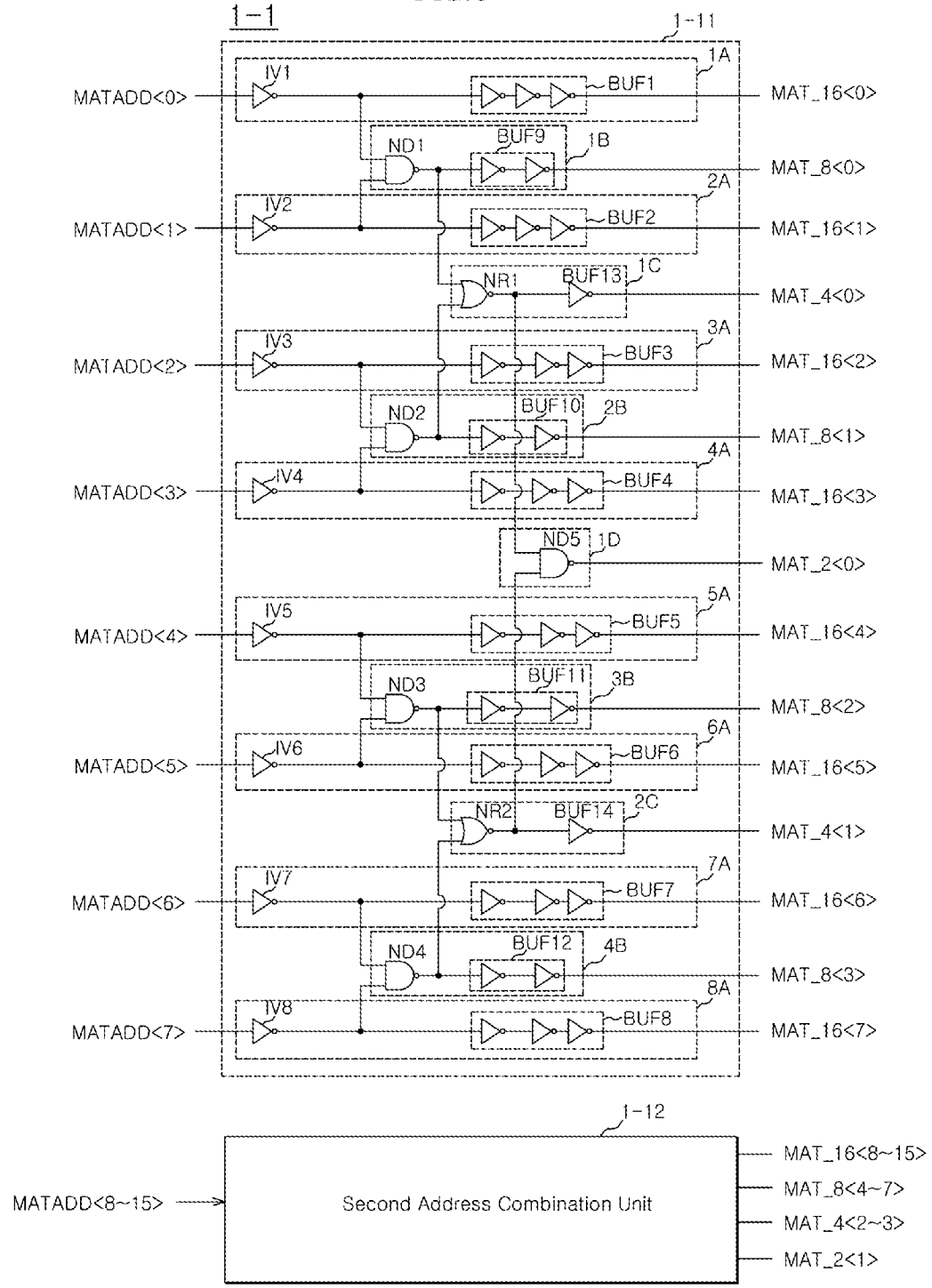
FIG. 6 is a circuit diagram of a combined mat address generation unit of FIG. 5.

FIG. 6 is a circuit diagram of the combined mat address generation unit 1_1.

In FIG. 6, the combined mat address generation unit 1_1 is divided into a first address combination unit 1_11 and a second address combination unit 1_12, for convenience of description. The first and second address combination units 1_11 and 1_12 similar configuration, and the process of combining 16 mat addresses MATADD<0~15> is divided into two parts. Hereafter, the detailed configuration of the first address combination unit 1_11 will be described. The descriptions may be applied to the second address combination unit 1_12.

The first address combination unit 1_11 includes eight buffer sections 1A to 8A, four first combination sections 1B to 4B, two second combination sections 1C and 2C, and one third combination section 1D.

The buffer sections 1A to 8A are configured to buffer the eight mat addresses MATADD<0~7> to output the buffered addresses as the first combined mat addresses MAT_16<0~7>. The buffer sections 1A to 8A include inverters IV1 to IV8 and buffer stages BUF1 to BUF8, respectively, to buffer the eight mat addresses MATADD<0~7>.

The first combination sections 1B to 4B are configured to divide the eight first combined mat addresses MAT_16<0~7> by two adjacent addresses, and to select a corresponding second combined mat address among the four second combined mat addresses MAT_8<0~3> when any one of each two adjacent addresses is selected. The first combination sections 1B to 4B include NAND gates ND1 to ND4 and buffer stages BUF9 to BUF12, respectively. The NAND gates ND1 to ND4 are configured to receive two adjacent addresses among the inverted mat addresses MADADD<0~7>, and the buffer stages BUF9 to BUF12 are configured to buffer outputs of the NAND gates ND1 to ND4, respectively.

The second combination sections 1C and 2C are configured to divide the four second combined mat addresses MAT_8<0~3> by two adjacent addresses, to select a corresponding third mat address between the two third combined mat addresses MAT_4<0~1>, when any one of each two adjacent addresses is selected. The second combination sections 1C and 2C include NOR gates NR1 and NR2 and buffer stages BUF13 and BUF14, respectively. The NOR gates NR1 and NR2 are configured to receive two adjacent output signals among the output signals of the NAND gates ND1 to ND4, and the buffer stages BUF13 and BUF14 are configured to buffer outputs of the NOR gates NR1 and NR2, respectively.

The third combination section 1D is configured to select and output the fourth combined mat address MAT_2<0> when any one of the two third combined mat addresses MAT_4<0~1> is selected. The third combination section 1D includes a NAND gate ND5 configured to receive the output signals of the NOR gates NR1 and NR2.

The first address combination unit 1_11 receives the eight mat addresses MATADD<0~7>, and generates the eight first combined mat addresses MAT_16<0~7>, the four second combined mat addresses MAT_8<0~3>, the two third combined mat addresses MAT_4<0~1>, and the one fourth combined mat address MAT_2<0>.

Similarly, the second address combination unit 1_12 receives the other eight mat addresses MADADD<8~15>, and generates the other eight first combined mat addresses MAT_16<8~15>, the other four second combined mat addresses MAT_8<4~7>, the other two third combined mat addresses MAT_4<2~3>, and the other fourth combined mat address MAT_2<1>.

The combined mat address generation unit may additionally include a combined mat address selection unit configured to output the third combined mat addresses MAT_4<0~3> instead of the fourth combined mat addresses MAT_2<0~1>, depending on the number of fuses which are to be included in a redundancy circuit. For example, the existing redundancy circuit includes 256 fuses. In this embodiment of the present invention, however, 240 fuses are needed when addresses are combined and outputted in the above-described manner. Therefore, when 256 fuses are to be used, the third combined mat addresses MAT_4<0~3> may be outputted instead of the fourth combined mat addresses MAT_2<0~1>.

Figure 7:
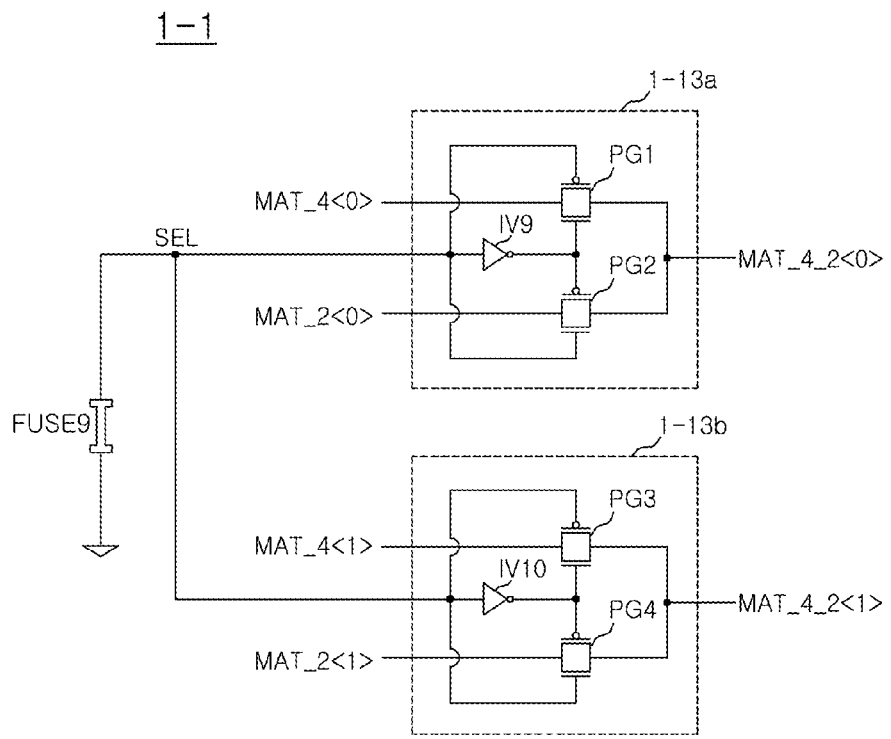
FIG. 7 is a circuit diagram of a combined mat address selection unit which may be additionally included in the combined mat address generation unit of FIG. 5, FIGS. 8A and 8B are block diagrams of first and second fuse units of FIG. 5, respectively.

FIG. 7 is a circuit diagram of a combined mat address selection unit 1_13 which may be additionally included in the combined mat address generation unit.

The combined mat address selection unit 1_13 includes a fuse FUSE9, a first selector 1_13a, and a second selector 1_13b.

Whether or not to cut the fuse FUSE9 is determined according to an initial setting. Accordingly, a third combined mat address MAT_4 or a fourth combined mat address MAT_2 is selected.

A select signal SEL is determined according to whether or not the fuse FUSE9 is cut. The selectors 1_13a and 1_13b are provided for the respective addresses, and each includes two pass gates PG1 and PG2 or PG3 and PG4 and one inverter IV9 or IV10. The operation of the first selector 1_13a will be described as follows. When the select signal SEL is deactivated according to whether or not the fuse FUSE9 is cut, the first pass gate PG1 is turned on to output the third combined mat address MAT_4<0>. On the other hand, when the select signal SEL is activated according to whether or not the fuse FUSE9 is cut, the second pass gate PG2 is turned on to output the fourth combined mat address MAT_2<0>. The operation of the second selector 1_13b is performed in a similar manner.

Figure 8A:
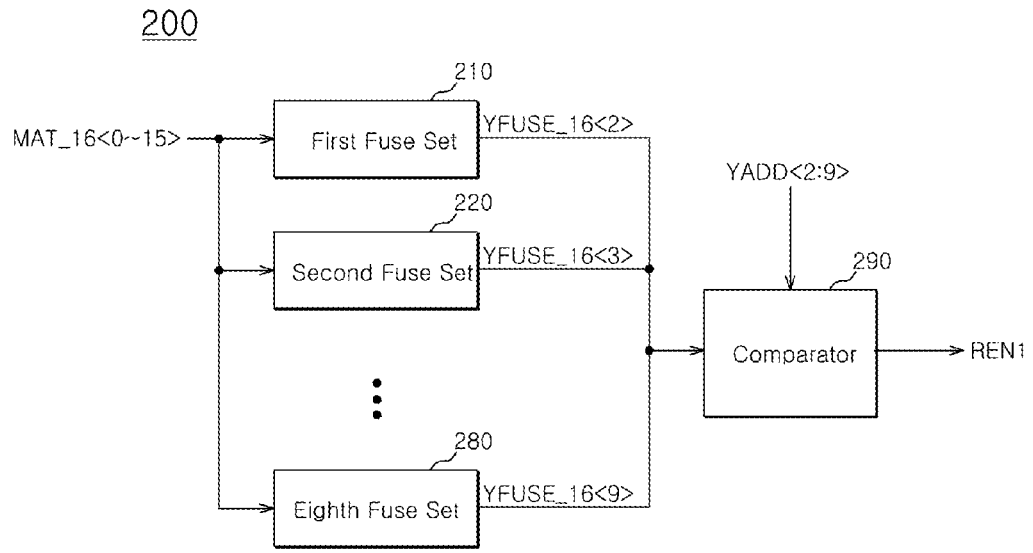
Figure 8B:
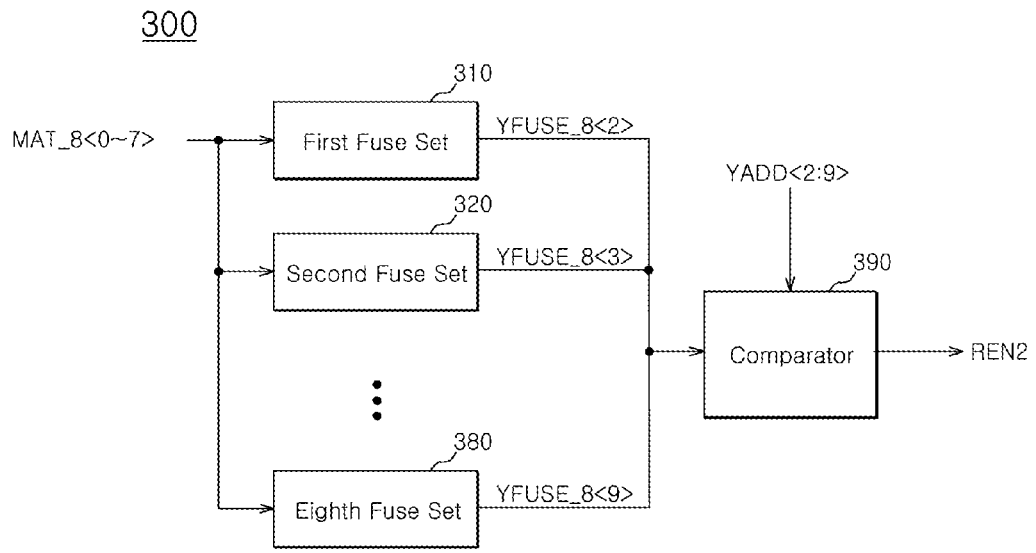

FIGS. 8A and 8B are block diagrams of the first and second fuse units 200 and 300, respectively. The third and fourth fuse units 400 and 500 may be configured in a similar manner as described with reference to FIGS. 8A and 8B.

The first and second fuse units 200 and 300 of FIGS. 8A and 8B may be configured and operated in a similar manner to the first fuse unit 20 of FIG. 2.

The first and second fuse units 200 and 300 include first to eighth fuse sets 210 to 280 and 310 to 380 and comparators 290 and 390, respectively. The numbers of the first to eighth fuse sets 210 to 280 and 310 to 380 correspond to the bit number of the column address YADD<2:9>.

Each of the fuse sets 210 to 280 included in the first fuse unit 200 includes a plurality of fuses corresponding to the number of the first combined mat addresses MAT_16<0~15>.

Figure 9A:
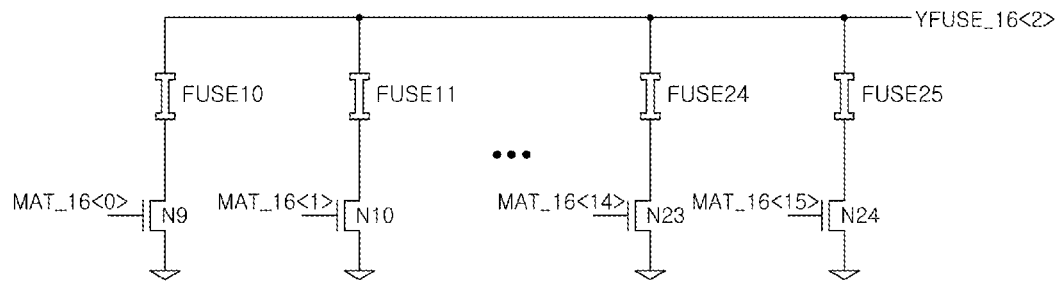
FIGS. 9A and 9B are circuit diagrams of first fuse sets of FIGS. 8A and 8B, respectively.

For example, referring to FIG. 9A, the first fuse set 210 of the first fuse unit 200 includes a plurality of fuses FUSE10 to FUSE25 allocated for the first column address bit YADD<2>. The fuses FUSE10 to FUSE25 are connected to 16 transistors N9 to N24 to receive the first combined mat addresses MAT_16<0~15>, respectively. The state of a first fuse signal YFUSE_16<2> is determined according to whether or not the fuses FUSE10 to FUSE25 are cut.

When none of the fuses are cut, a deactivated first fuse signal YFUSE_16<2> is outputted regardless of which one of the first combined mat addresses MAT_16<0~15> is selected. On the other hand, when any one of the first combined mat addresses MAT_16<0~15> is selected and a fuse corresponding to the selected address is cut, an activated first fuse signal YFUSE_16<2> is outputted.

The second to eighth fuse sets 220 to 280 include a plurality of fuses allocated for the second to eighth column address bits YADD<3:9>, and operate in a similar manner to the first fuse set 210 so as to output second to eighth fuse signals YFUSE_16<3~9>, respectively.

The comparator 290 is configured to receive the column address YADD<2:9>, compare the column address YADD<2:9> to the first to eighth fuse signals YFUSE_16<3~9>, and output a first redundancy column enable signal REN1. When the first to eighth fuse signals YFUSE-16<2~9> are matched with the inputted column address YADD<2:9>, the first redundancy column enable signal REN1 is activated.

When the first redundancy column enable signal REN1 is activated, a column of a mat corresponding to a selected first combined mat address may be replaced with a redundancy column.

Similarly, each of the fuse sets 310 to 380 included in the second fuse unit 300 includes a plurality of fuses corresponding to the number of the second combined mat addresses MAT_8<0~7>.

Figure 9B:
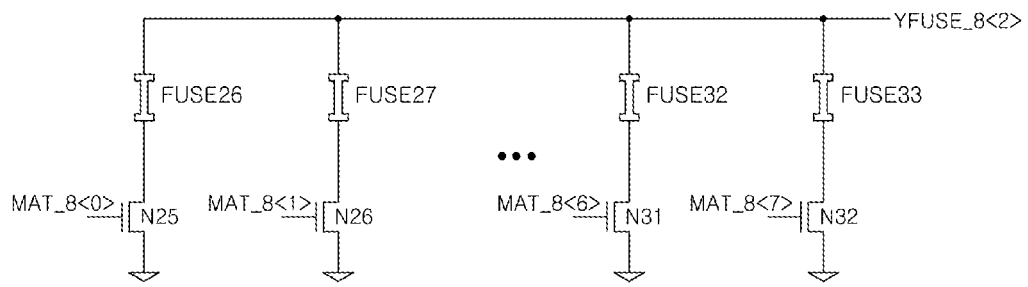

For example, referring to FIG. 9B, the first fuse set 310 of the second fuse unit 300 includes a plurality of fuses FUSE26 to FUSE33 allocated for the first column address bit YADD<2>. The fuses FUSE26 to FUSE33 are connected to eight transistors N25 to N32 to receive the second combined mat addresses MAT_8<0~7>, respectively. The state of a first fuse signal YFUSE_8<2> is determined according to whether or not the fuses FUSE26 to FUSE33 are cut.

When none of the fuses are cut, a deactivated first fuse signal YFUSE_8<2> is outputted regardless of which one of the second combined mat addresses MAT_8<0~7> is selected. On the other hand, when any one of the second combined mat addresses MAT_8<0~7> is selected and a fuse corresponding to the selected address is cut, the activated first fuse signal YFUSE_8<2> is outputted.

The second to eighth fuse sets 320 to 380 include a plurality of fuses allocated for the second to eighth column address bits YADD<3:9> and operate in a similar manner to the first fuse set 310 so as to output second to eighth fuse signals YFUSE_8<3~9>.

The comparator 390 is configured to receive the column address YADD<2:9>, compare the column address YADD<2:9> to the first to eighth fuse signals YFUSE_8<3~9>, and output a second redundancy column enable signal REN2. When the first to eighth fuse signals YFUSE_8<2~9> are matched with the inputted column address YADD<2:9>, the second redundancy column enable signal REN2 is activated.

When the second redundancy column enable signal REN2 is activated, columns of two mats corresponding to a selected second combined mat address may be replaced with redundancy columns.

Fuse sets (not illustrated) included in the third and fourth fuse units 400 and 500 may also include a plurality of fuses corresponding to the numbers of the third and fourth combined mat addresses MAT_4<0~3> and MAT_2<0~1>, respectively. According to the above-described operation, the third fuse unit 400 activates a third redundancy column enable signal REN3, and the fourth fuse unit 500 activates a fourth redundancy column enable signal REN4.

When the third redundancy column enable signal REN3 is activated, columns of four mats corresponding to a selected third combined mat address may be replaced with redundancy columns.

When the fourth redundancy column enable signal REN4 is activated, columns of eight mats corresponding to a selected fourth combined mat address may be replaced with redundancy columns.

Figure 10:
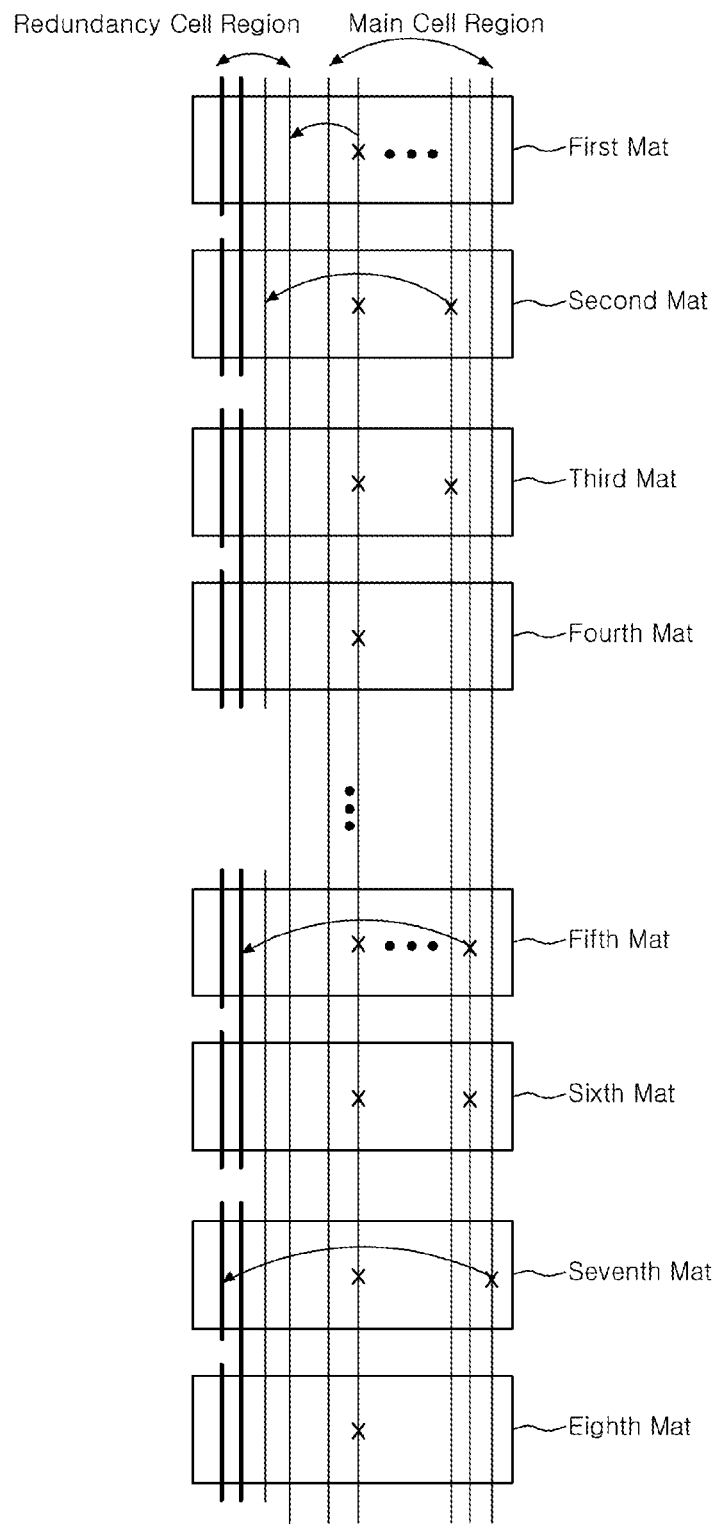
FIG. 10 illustrates a column repair operation according to an embodiment of the present invention.

FIG. 10 illustrates the column repair operation according to an embodiment of the present invention.

In a main cell region, a failure may occur in memory cells of individual columns, or a column failure may occur in the entire mats due to factors such as tainted process environments.

According to an embodiment of the present invention, when an individual memory cell failure occurs in a seventh mat, the first fuse unit 200 may activate the first redundancy column enable signal REN1 to replace a single column with a redundancy column.

When a column failure occurs in first to eighth mats, the fourth fuse unit 500 may activate the fourth redundancy column enable signal REN4 to replace columns of eight mats with redundancy columns.

When a column failure occurs in the fifth and sixth mats, the second fuse unit 300 may activate the second redundancy column enable signal REN2 to replace columns of two mats with redundancy columns.

When a column failure occurs in the second and third mats, the third fuse unit 400 may activate the third redundancy column enable signal REN3 to replace columns of four mats with redundancy columns.

While certain embodiments have been described above, it will be understood to those skilled in the art that the embodiments described are by way of example only. Accordingly, the column repair circuit described herein should not be limited based on the described embodiments. Rather, the column repair circuit described herein should only be limited in light of the claims that follow when taken in conjunction with the above description and accompanying drawings.

What is claimed is:

1. A column repair circuit of a semiconductor memory apparatus, which includes a plurality of mats and performs a column repair operation to replace failed cells among a plurality of memory cells provided in the mats, the column repair circuit comprising:
two or more fuse units configured to perform the column repair operation; and
a combined mat address generation unit configured to receive mat addresses and generate first combined mat addresses combined in unit of m mats and second combined mat addresses combined in unit of n mats,
wherein each of the fuse units comprises a plurality of fuses, and is configured in such a manner that the m mats correspond to one fuse and the n mats correspond to another fuse, where m and n are natural numbers greater than or equal to 1 and differ from each other.

2. The column repair circuit according to claim 1, wherein the fuse units comprise:
a first fuse unit comprising a plurality of fuses corresponding to the first combined mat addresses, and configured to generate a first redundancy column enable signal according to whether a fuse corresponding to a first combined mat address with respect to an inputted column address is cut or not; and
a second fuse unit comprising a plurality of fuses corresponding to the second combined mat address, and configured to generate a second redundancy column enable signal according to whether a fuse corresponding to a selected second combined mat address with respect to the inputted column address is cut or not.

3. The column repair circuit according to claim 2, wherein the first fuse unit comprises:
a plurality of fuse sets allocated to the respective bits of the column address; and
a comparator configured to compare a plurality of fuse signals to the column address and generate the first redundancy column enable signal, and
each of the fuse sets comprises the plurality of fuses corresponding to the first combined mat addresses, and activate a fuse signal according to whether the fuse corresponding to the selected first combined mat address is cut or not.

4. The column repair circuit according to claim 2, wherein the second fuse unit comprises:
a plurality of fuse sets allocated to the respective bits of the column address; and
a comparator configured to compare a plurality of fuses signals to the column address and generate the second redundancy column enable signal, and
each of the fuse sets comprises the plurality of fuses corresponding to the second combined mat addresses, and activates a fuse signal according to whether the fuse corresponding to the selected second combined mat address is cut or not.

5. The column repair circuit according to claim 2, wherein, when the first redundancy column enable signal is activated, columns of the m mats corresponding to the fuse are replaced with redundancy columns.

6. The column repair circuit according to claim 2, wherein, when the second redundancy column enable signal is activated, columns of the n mats corresponding to the fuse are replaced with redundancy columns.

7. A column repair circuit comprising:
a combined mat address generation unit configured to receive mat addresses, perform one or more combination steps according to a method of combining the received mat addresses by adjacent addresses and recombining the combination results by adjacent values, and outputs the received mat addresses and the combination results of the respective combination steps as combined mat addresses of the respective steps; and
two or more fuse units each comprising a plurality of fuses corresponding to the combined mat addresses with respect to respective bits of a column address, and configured to replace a corresponding column of the inputted column address with a redundancy column according to whether a fuse corresponding to a selected combined mat address is cut or not,
wherein each of the fuse units receives the combined mat addresses outputted at any one step.

8. The column repair circuit according to claim 7, wherein the combined mat address generation unit comprises:
a buffer configured to buffer the mat addresses and output the buffered addresses as first combined mat addresses; and
a first combination section configured to divide the first combined mat addresses into a plurality of groups each including adjacent addresses, and select and output a second combined mat address when any one of the first combined mat addresses of a corresponding group is selected.

9. The column repair circuit according to claim 8, wherein the fuse units comprise:
a first fuse unit comprising a plurality of fuses corresponding to the first combined mat addresses, and configured to generate a first redundancy column enable signal according to whether a fuse corresponding to the selected first combined mat address with respect to the inputted column address is cut or not; and
a second fuse unit comprising a plurality of fuses corresponding to the second combined mat address, and configured to generate a second redundancy column enable signal according to whether a fuse corresponding to the selected second combined mat address with respect to the inputted column address is cut or not.

10. The column repair circuit according to claim 9, wherein the first fuse unit comprises:
a plurality of fuse sets allocated to the respective bits of the column address; and
a comparator configured to compare a plurality of fuse signals to the column address and generate the first redundancy column enable signal, and
each of the fuse sets comprises the plurality of fuses corresponding to the first combined mat addresses, and activate a fuse signal according to whether the fuse corresponding to the selected first combined mat address is cut or not.

11. The column repair circuit according to claim 9, wherein the second fuse unit comprises:
a plurality of fuse sets allocated to the respective bits of the column address; and
a comparator configured to compare a plurality of fuses signals to the column address and generate the second redundancy column enable signal, and
each of the fuse sets comprises the plurality of fuses corresponding to the second combined mat addresses, and activates a fuse signal according to whether the fuse corresponding to the selected second combined mat address is cut or not.

12. The column repair circuit according to claim 10, wherein, when the first redundancy column enable signal is activated, a column of a mat corresponding to the fuse is replaced with a redundancy column.

13. The column repair circuit according to claim 10, wherein, when the second redundancy column enable signal is activated, columns of mats corresponding to the fuse are replaced with redundancy columns.

14. A column repair circuit comprising:
a combined mat address generation unit configured to receive x mat addresses, perform a plurality of combination steps according to a method of combining the received x mat addresses by adjacent addresses and recombining the combination results by adjacent values, and output the x mat addresses, x/2 combination results, x/4 combination results, and x/8 combination results as combined mat addresses of the respective steps; and
two or more fuse units each comprising a plurality of fuses corresponding to the combined mat addresses with respect to respective bits of a column address, and configured to replace a corresponding column of the inputted column address with a redundancy column according to a fuse corresponding to a selected combined mat address is cut or not,
wherein each of the fuse units receives the combined mat addresses outputted at any one of the steps.

15. The column repair circuit according to claim 14, wherein the combined mat address generation unit comprises:
a buffer section configured to buffer the x mat addresses and output the buffered addresses as x first combined mat addresses;
a first combination section configured to divide the x first combined mat addresses by two adjacent addresses, and select and output a second combined mat address among x/2 second combined mat addresses when any one of each two adjacent addresses is selected;
a second combination section configured to divide the x/2 second combined mat addresses by two adjacent addresses, and select and output a third combined mat address among x/4 third combined mat addresses when any one of each two adjacent addresses is selected; and
a third combination section configured to divide the x/4 third combined mat addresses by two adjacent addresses, and select and output a fourth combined mat address among x/8 fourth combined mat addresses when any one of each two adjacent addresses is selected.

16. The column repair circuit according to claim 15, wherein the fuse units comprise:
a first fuse unit configured to generate a first redundancy column enable signal according to whether a fuse corresponding to the first combined mat addresses with respect to the inputted column address is cut or not;
a second fuse unit configured to generate a second redundancy column enable signal according to whether a fuse corresponding to the second combined mat addresses with respect to the inputted column address is cut or not;
a third fuse unit configured to generate a third redundancy column enable signal according to whether a fuse corresponding to the third combined mat addresses with respect to the inputted column address is cut or not; and
a fourth fuse unit configured to generate a fourth redundancy column enable signal according to whether a fuse corresponding to the fourth combined mat addresses with respect to the inputted column address is cut or not.

17. The column repair circuit according to claim 16, wherein, when the first redundancy column enable signal is activated, a column of a mat corresponding to the fuse is replaced with a redundancy column,
when the second redundancy column enable signal is activated, columns of two mats corresponding to the fuse are replaced with redundancy columns;
when the third redundancy column enable signal is activated, columns of four mats corresponding to the fuse are replaced with redundancy columns; and
when the fourth redundancy column enable signal is activated, columns of eight mats corresponding to the fuse are replaced with redundancy columns.

18. The column repair circuit according to claim 16, wherein the combined mat address generation unit further comprises a combined mat address selection section configured to apply the third combined mat addresses to the fourth fuse unit instead of the fourth combined mat addresses, in response to an initial setting select signal.

\* \* \* \* \*